United States Patent [19]

Suzuki et al.

[11] 4,303,464

[45] Dec. 1, 1981

[54] METHOD OF MANUFACTURING GALLIUM PHOSPHIDE SINGLE CRYSTALS WITH LOW DEFECT DENSITY

[75] Inventors: Takashi Suzuki, Nishinomiya; Shin-ichi Akai, Osaka; Hideki Mori, Sakai; Katsunosuke Aoyagi, Suita; Takashi Shimoda, Osaka; Kazuhisa Matsumoto, Ibaraki; Masami Sasaki, Takarazuka, all of Japan

[73] Assignee: Sumitomo Electric Industries, Ltd., Osaka, Japan

[21] Appl. No.: 130,407

[22] Filed: Mar. 14, 1980

Related U.S. Application Data

[62] Division of Ser. No. 949,079, Oct. 6, 1978, abandoned.

[30] Foreign Application Priority Data

Oct. 17, 1977 [JP] Japan .................. 52-124839

[51] Int. Cl.³ .............................................. C30B 15/04
[52] U.S. Cl. .............................. 156/605; 156/617 SP; 156/607
[58] Field of Search .................. 252/62.3 A; 156/605, 156/607, 617 SP, DIG. 70; 148/1.5, 171

[56] References Cited

U.S. PATENT DOCUMENTS 3,874,952  4/1975  Woodall ..................... 252/62.3 A

OTHER PUBLICATIONS

Brantley et al., J. Appl. Phys., vol. 46, No. 6, 1975 p. 2629.
Iizuka, "J. Electrochem. Soc.: Solid State Sci." vol. 118, No. 7, 1971, p.1190.
Petroff et al., "J. of Appl. Phys." vol. 47, No. 4, 1976, p. 1583.
Nygren, "J. of Crys. Growth," 19, 1973, p. 21.
Morrison et al., "J. Phys. C.: Solid State Phys." vol. 7, 1974, p. 633.
Young et al., "J. Phys. D.: Appl. Phys." 1971, vol. 4, p. 995.
Hayes et al., "J. Phys. C.: Solid State Phys." 1969, Ser. 2, vol. 2, p. 2402.
Rozgonyi et al., "J. Appl. Phys." vol. 43, No. 7, 1972, p. 3141.
Bass et al., 1966 Proc. Int. Symp. on GaAs, Reading (London: Inst. Phys.) pp. 41–45.

*Primary Examiner*—Hiram Bernstein
*Attorney, Agent, or Firm*—Carothers and Carothers

[57] ABSTRACT

Gallium phosphide single crystals with low defect density which are manufactured by the liquid encapsulation Czochralski pulling method and which are characterized in that they are doped or not doped with at least one kind of dopant which is electrically active in gallium phosphide and are so doped as to have at least one dopant such as boron or some other strongly reducing impurity which has a reducing activity equal to or greater than that of boron remain in the crystals in a quantity not less than $1 \times 10^{17}$ cm$^{-3}$ and the sum of dislocation etch pit density and small conical etch pit density of the surface (111)B which has been subjected to etching for 3 to 5 minutes with RC etchant at a temperature of 65° C.~75° C. after removing the mechanically damaged layer on the surface does not exceed $1 \times 10^5$ cm$^{-2}$, and a method of manufacturing the crystals.

4 Claims, 9 Drawing Figures

METHOD OF MANUFACTURING GALLIUM PHOSPHIDE SINGLE CRYSTALS WITH LOW DEFECT DENSITY

CROSS REFERENCE TO RELATED APPLICATION

This is a division of patent application Ser. No. 949,079 filed Oct. 6, 1978 for Gallium Phosphide Single Crystals With Low Defect Density And A Method of Manufacturing Them, now abandoned.

BACKGROUND OF THE INVENTION

The present invention relates to an improvement in gallium phosphide (GaP) single crystals manufactured by the well-known or conventional liquid encapsulation Czochralski pulling method "See 'Pulling of Gallium Phosphide crystals in liquid encapsulation' by S. J. Bass and P. E. Oliver in Journal of Crystal Growth 3-4 (1968) 286–290", (hereinafter to be referred to as the LEC method) with novel improvements. More particularly, it relates to GaP single crystals with low defect density doped with a strongly reducing impurity such as silicon and a method of manufacturing such crystals.

In the manufacture of GaP single crystals, employment of the LEC method has made it possible to obtain large sized crystals. However, the environment for growth of a GaP crystal is such that the temperature of the melt is required to be high, such as approximately 1500° C., and in addition, the crystal is pulled up in boron oxide ($B_2O_3$) encapsulant having a temperature gradient of 200° C. ~ 500° C. in a high pressure gas of about 50 kg/cm$^2$. Consequently, the crystal is subjected to heavy thermal stress, so that plastic deformation of the crystal takes place and a great number of dislocations are introduced or multiplied. If the (111)B surface of a GaP crystal obtained by the LEC method in this manner is examined with RC etchant (see "Effect of dislocation on green electroluminescense efficiency in GaP grown by liquid phase epitaxy" by W. A. Brantley and others in Journal of Applied Physics, Vol. 46, No. 6, June 1975, p. 2629), the dislocation etch pit density (hereinafter to be referred to briefly as D-EPD) is usually found to be $1 \sim 10 \times 10^5$ cm$^{-2}$. Beside these dislocation etch pits, a large number of the so-called saucer pits, which are small pits shaped like shallow saucers, are also observed, and sometimes their density reaches the order of $10^7$ cm$^{-2}$. Regarding this saucer pit (hereinafter to be referred to as S pit), a detailed report is made by T. Iizuka in "Etching Studies of Impurity Precipitates in Pulled GaP Crystals" (J. Electrochem. Soc.: SOLID STATE SCIENCE July 1971 Vol. 118, p. 1190). It is stated therein that S pits are probably due to precipitates related to the impurity used for doping or, in the case of undoped crystals, precipitates related to the residual impurities such as boron, silicon, carbon or oxygen.

Generally, there are many defects existing in LEC GaP as mentioned above. On the other hand, however, GaP single crystals having few defects are demanded for their application product, light emitting diodes (LED), to improve their light emitting efficiency. For example, it is stated in the "Effect of dislocations on green electroluminescence efficiency in GaP grown by liquid phase epitaxy" (Journal of Applied Physics, Vol. 46, No. 6, June 1975, p. 2629) by W. A. Brantly et al, that the electroluminescent efficiency of green LED is dependent on the dislocation density of the epitaxial layer and that, when it is not less than $10^5$ cm$^{-2}$, the electroluminescent efficiency decreases greatly as the dislocation density increases. Also, since the D-EPD of the epitaxial layer about corresponds to the D-EPD of the substrate where the D-EPD of the substrate is in the order of $10^5$ cm$^{-2}$, it can be seen that it is ultimately necessary to lower the defect density of the substrate and lower the D-EPD of the epitaxial layer. It is desirable that the D-EPD of epitaxial layer for green LED not be in excess of $1 \times 10^5$ cm$^{-2}$, and if possible, not in excess of $5 \times 10^4$ cm$^{-2}$.

One method employed for making LEC GaP single crystals which have few defects is a method wherein they are pulled from non-stoichiometric melts. For example, this is reported in "Defect Studies of GaP Crystals Pulled from Nonstoichiometric Melts: Dislocation and 'Saucer' Etch Pits" (J. Appl. Phys. Vol. 43, No. 7, July 1972, p. 3141) by G. A. Roxgonyl et al, and crystals with D-EPD in the order of $10^2$ cm$^{-2}$ and without S pits were obtained. However, because the density of gallium inclusion increases, the pulling speed is extremely slow and high yield of single crystals cannot be expected, and thus, the method in which pulling is done from non-stoichiometric melts is not suitable for industrial purposes as compared with the method in which pulling is done from nearly stoichiometric melts.

On the other hand, crystals with D-EPD in the order of $10^4$ cm$^{-2}$ may be found among conventional sulphur-doped LEC GaP crystals. In many cases, however, the EPD of epitaxial growth layers on these substrates becomes in the order of $10^5$ cm$^{-2}$ and this does not help toward attaining the object of decreasing EPD of epitaxial growth layer. This point was taken up, for example, in "Dislocation in the liquid phase epitaxial growth layer and LEC substrate of GaP", (Book of Lecture Papers 2, 24th Associated and Combined Lecture Meeting of the Japanese Society of Applied Physics, 1977, No. 28p - Q-4, p. 433), wherein small conical pits which are neither the so-called dislocation pits nor what are called S pits are observed in the substrate, and if their density is added to the ordinary D-EPD, it almost coincides with the D-EPD of the epitaxial layer. This means that a substrate of which the sum of D-EPD and small conical etch pit density is in the order of $10^4$ cm$^{-2}$ is required to obtain an epitaxial layer of a low D-EPD in the order of $10^4$ cm$^{-2}$.

SUMMARY OF THE INVENTION

An object of the present invention is to provide new gallium phosphide single crytals with a low defect density which are different from the afore-mentioned crystals with a low D-EPD, but which not only have a low D-EPD but also a low density of small conical pits.

Another object of the present invention is to provide gallium phosphide single crystals with a low defect density, on which the epitaxial layer can also be grown with a low D-EPD.

Another object of the present invention is to solve the problems of inaccuracy and non-reproducibility in doping with a strongly reducing impurity and provide an appropriate method of manufacturing the afore-mentioned gallium phosphide with a low defect density with good accuracy and good reproducibility.

The present invention relates to gallium phosphide single crystals with a low defect density which are gallium phosphide single crystals manufactured by the liquid encapsulation Czochralski pulling method and which is characterized in that they are doped or not doped with at least one kind of dopant which is electrically active in gallium phosphide, and are so doped such that they have at least one dopant such as boron and other strongly reducing impurities which have a reducing activity equal to or greater than that of boron remain in the crystals in a quantity not less than $1 \times 10^{17}$ cm$^{-2}$ and the sum of dislocation etch pit density and small conical etch pit density of the (111)B surface which has been subjected to etching for 3 to 5 minutes with RC etchant at a temperature of 65° C.~75° C. after removing the mechanically damaged layer on the surface does not exceed $1 \times 10^5$ cm$^{-2}$. Furthermore, it provides gallium phosphide single crystals with a low defect density doped with boron as crystals which are easy to obtain for practical purposes.

Also, the manufacturing method according to the present invention is an improved liquid encapsulation Czochralski method of manufacturing gallium phosphide single crystals with a low defect density, which is characterized in that gallium phosphide is doped with at least one dopant such as boron or other strongly reducing impurities which have a reducing activity equal to or greater than that of boron under such a condition that oxygen concentration in the raw material melt of gallium phosphide is 0.15 mol percent or less than that doping level of said strongly reducing impurity in the single crystal is controlled to be $1 \times 10^{17}$ cm$^{-3}$ or more with good reproducibility. The single crystal thus obtained has a low defect density, that is to say, the sum of dislocation etch pit density and small conical pit density already mentioned on the (111)B surface thereof does not exceed $1 \times 10^5$ cm$^{-2}$.

BRIEF DESCRIPTION OF THE DRAWINGS

Other objects and advantages appear in the following description and claims.

The accompanying drawings show, for the purpose of exemplification without limiting the invention or the claims thereto, certain practical embodiments illustrating the principles of this invention wherein:

DETAILED DESCRIPTION OF THE PREFERRED EMBODIMENTS

Figure 3:
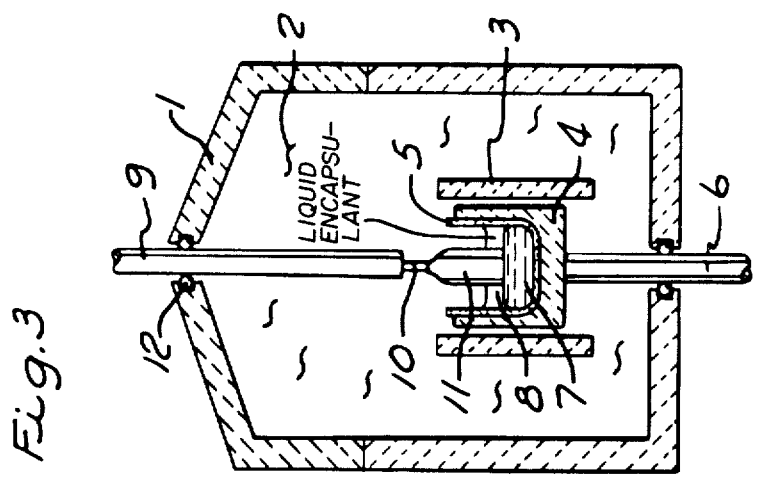
FIG. 3 is a diagrammatic sectional sketch in front elevation of the high pressure single crystal pulling furnace used in the examples of embodiment of the present invention.

In the present invention, one or both of boron and silicon are especially suitable as strongly reducing impurities.

In case boron is used, it is preferable that its concentration remaining in gallium phosphide be from $1 \times 10^{17}$ cm$^{-3}$ to $1 \times 10^{20}$ cm$^{-3}$.

Silicon itself may also be used as the electrically active dopant, or another n-type dopant or p-type dopant may be used, its carrier concentration being preferably from $1 \times 10^{17}$ cm$^{-3}$ to $5 \times 10^{18}$ cm$^{-3}$ at 300° K.

In case silicon is used as the strongly reducing impurity, it is preferable that its concentration remaining in gallium phosphide be from $1 \times 10^{17}$ cm$^{-3}$ to $5 \times 10^{18}$ cm$^{-3}$, and even when the diameter is 30 mm or more, gallium phosphite single crystals with a low defect density can be obtained. In this case, n-type or p-type dopant is used as its dopant and its carrier concentration is preferably from $1 \times 10^{17}$ cm$^{-3}$ to $2 \times 10^{18}$ cm$^{-3}$ at 300° K.

There are several reports on LEC GaP crystals doped with silicon or boron. For example, there is "Infrared absorption of gallium phosphide containing boron" by W. Hayes, H. F. MacDonald and C. T. Sennett (J. Phys. C.: Solid St. Phys. 1969, Ser. 2, Vol. 2, p. 2402), in which a crystal having a boron concentration of $3 \times 10^{18}$ cm$^{-3}$ is used as a specimen.

In "The behaviour of boron impurities in n-type gallium arsenide and gallium phosphide" by S. R. Morison, R. C. Newman and F. Thompson (J. Phys. C: Solid State Phys. Vol. 7, 1974, p. 633), crystals doped with boron ($3.8 \times 10^{18}$ cm$^{-3}$) and silicon ($2 \times 10^{17}$ cm$^{-3}$), and with boron ($9.4 \times 10^{18}$ cm$^{-3}$) and silicon ($6 \times 10^{17}$ cm$^{-3}$) are used as specimens. However, nothing is mentioned in these reports about such crystalline properties as dislocation density and others.

In "The electrical properties of undoped and oxygen-doped GaP grown by the liquid encapsulation technique" (J. Phys. D: Appl. Phys. 1971, Vol. 4, p. 995), M. L. Young and S. J. Bass report the measurement of electrical properties with specimens of GaP crystals in which 0.5 atomic ppm ($3 \times 10^{16}$ cm$^{-3}$) to 40 atomic ppm ($2 \times 10^{18}$ cm$^{-3}$) of silicon and 4.5 atomic ppm ($2.3 \times 10^{17}$ cm$^{-3}$) to 500 atomic ppm ($2.5 \times 10^{19}$ cm$^{-3}$) of boron remained in the undoped or oxygendoped GaP due to contamination from the crucible or the like. It is stated in that paper that EPD is in the order of $10^4$ cm$^{-2}$ in the proximity of the seed and increases to the order of $10^5$ cm$^{-2}$ as it nears the end. However, nothing is mentioned about small conical etch pits. Neither is anything mentioned about the EPD of epitaxial layers having that crystal as their substrates. Furthermore, nothing is mentioned about the method of doping with silicon and boron and the relationship between the quantity of the dopants in the raw material and the silicon and boron concentrations in the crystals.

Furthermore, a Japanese Laid-Open Patent Application Gazette (Toku-Kai-Sho 52-No. 63065) shows an instance wherein GaP having a diameter of approximately 20 mm was doped by the LEC method with Al, which has a greater single-bond energy with P than Ga. In that case, a crystal with an etch pit density of 800~1000/cm$^2$ was obtained. As will be mentioned later in detail, in the situation where Al is doped by the ordinary LEC method, namely with a quartz crucible in use and $B_2O_3$ as encapsulant, it is boron and silicon that is doped in the crystal in large quantities, and it is considered that aluminum is included only in the form of an oxide. Furthermore, although a low etch pit density of 800~1000/cm$^2$ was obtained, nothing is mentioned therein about small conical etch pits and the EPD of the epitaxial growth layer on the crystal.

As has been stated above, no report at all has been made so far about the fact that silicon and boron in GaP play an important role as strongly reducing impurities.

It is difficult to dope GaP crystals with a strongly reducing impurity accurately and with good reproducibility. As will be mentioned in more detail with reference to examples of embodiment to be described later, when silicon-doped crystals are pulled with an ordinary product of B$_2$O$_3$ in use, an addition of 340 mg silicon in 400 g raw material sometimes produces crystals doped with $5\times 10^{17}$ cm$^{-3}$ silicon and sometimes crystals doped with $2\times 10^{18}$ cm$^{-3}$. Furthermore, there are also some cases wherein they are doped with $5\times 10^{17}$ cm$^{-3}$, even if silicon of 370 mg is added to the raw material. It is difficult, as such, to dope crystals with silicon accurately and with good reproducibility by the ordinary method. The manufacturing method of the present invention solves these problems of inaccuracy and non-reproducibility in the doping with a strongly reducing impurity, and provides a method for manufacturing gallium phosphide with a low defect density by effecting doping accurately and with good reproducibility.

Now the present invention will be explained in detail with reference to the drawings. First, the small conical etch pits which are important with respect to the properties of GaP single crystals will be explained.

Figure 1:
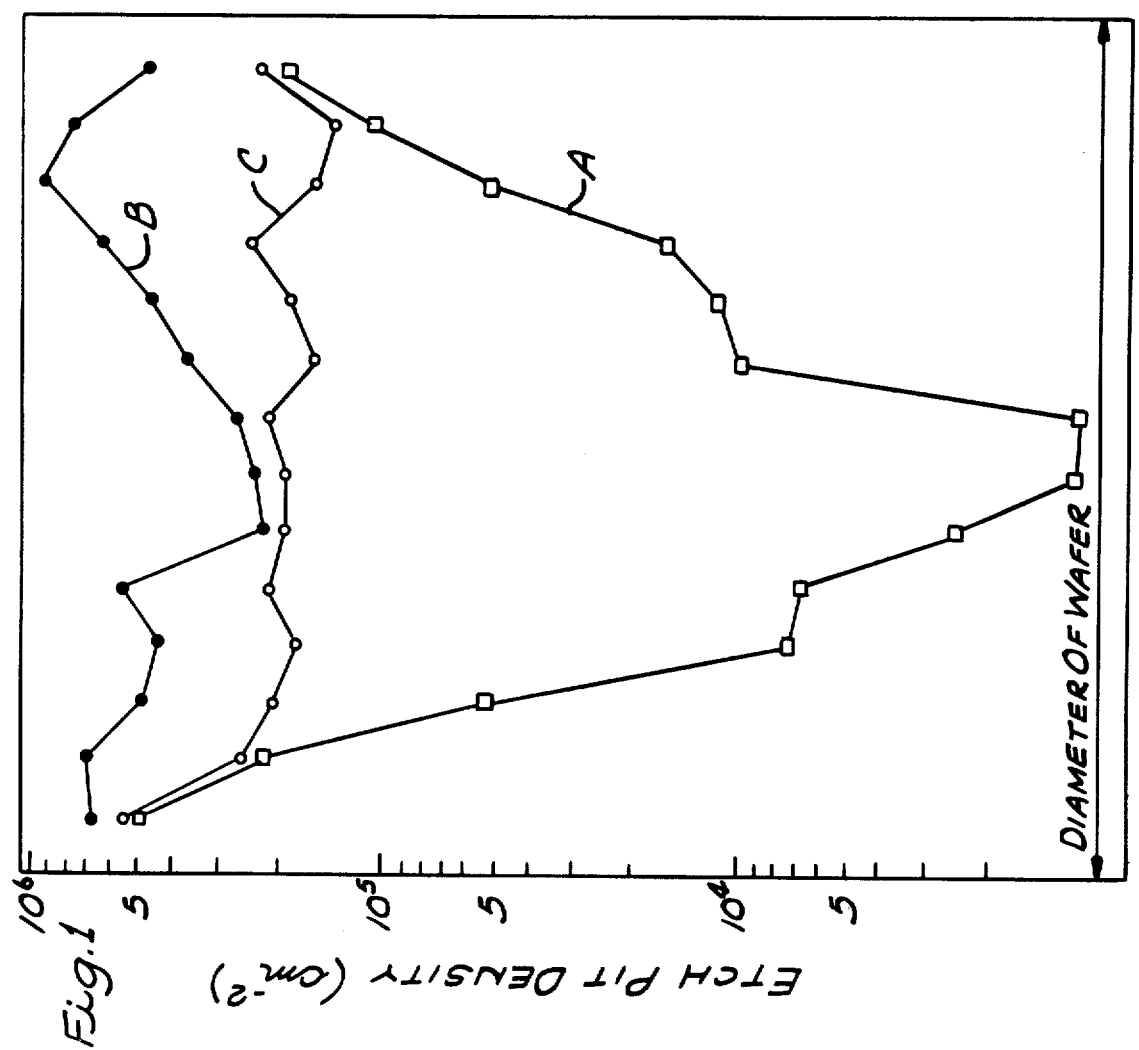
FIG. 1 is a diagram showing the distribution of etch pit density in a wafer of conventional sulphur-doped GaP single crystal.

FIG. 1 is a diagram showing the distribution (curve A) of so-called dislocation etch pit density (D-EPD) in a wafer surface of a coventional sulphur-doped GaP single crystal which was obtained by chance with low D-EPD and that of the epitaxial layer grown thereon (curve B). The horizontal axis represents the distance in the radial direction of the wafer and the vertical axis represents the etch pit density. The curve A shows the D-EPD of the substrate and curve B the D-EPD of the epitaxial layer.

Figure 2A:
FIGS. 2(a) and 2(b) are microscopic photographs of the etched surfaces of the substrate wafer on which the distributions of etch pit density shown in FIG. 1 was measured.
Figure 2B:
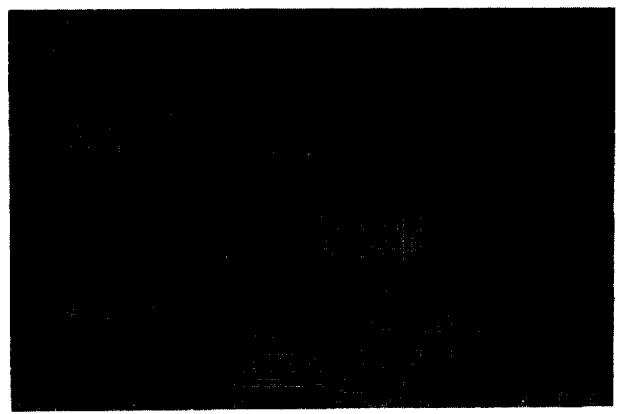

In the Figure, the D-EPD is in the order of $10^5$ cm$^{-2}$ in the peripheral area of the wafer in both the substrate and epitaxial layer, their values being comparatively near to each other. However, nearer to the center of the wafer, the D-EPD in the substrate decreases to the order of $10^5$-$10^4$ cm$^{-2}$, while the D-EPD in the epitaxial layer does not show a great decrease in the center region. The photographs of FIGS. 2(a) and 2(b) are microscopic photographs of the etched surface in the proximity of the center which were taken for the purpose of investigating the cause for this disagreement. Those pits which are marked D-P in these photographs are the so-called dislocation etch pits, and those pits which are marked CS-P are small conical etch pits. As can be seen from photograph (b) of high magnification, larger ones of these small etch pits are often found to be pair pits.

The sum of this small conical etch pit density (hereinafter to be referred to as CS-EPD) and the dislocation etch pit density (D-EPD) is represented by the curve C in FIG. 1. This sum is comparatively near to the EPD distribution in the epitaxial layer. That is to say, it can be said that the D-EPD of the epitaxial layer is about equal to the sum of the D-EPD and the CS-EPD of the substrate. It has already been stated that this is mentioned in the report by Beppu et al.

It is not clearly known what defect makes this small conical pit. In view of the following, however, it is considered different from the so-called dislocation etch pit and S pit.

(i) It is the same as the so-called dislocation etch pit in that it is a pit of a conical shape. However, its size is not enlarged much even if it is fully subjected to etching with RC etchant. Furthermore, when subjected to step etching, the core of an individual small conical etch pit disappears and leaves its trace as a flat-bottomed pit, which closely resembles the so-called S pit, while at that time most of the dislocation etch pits are enlarged in size but do not undergo any big change. Furthermore, other small conical etch pits newly make their appearance at a different location, so that the average density of small conical etch pits remains unchanged.

(ii) Of the small conical etch pits, larger ones are often found as a pair pit. They disappear as a pair when subjected to step etching. In view of this, this small etch pit may be considered to be a small dislocation loop reported by P. M. Petroff, O. G. Lorimer and J. M. Ralston in "Defect structure induced during forward-bias degradation of GaP green-light-emitting diodes" (Journal of Applied Physics, Vol. 47, No. 4, April 1976, p. 1583).

When the D-EPD of the substrate is in the order of $10^5$ cm$^{-2}$, it coincides comparatively well with the D-EPD of the epitaxial layer. However, in the case of an ordinary sulphur-doped substrate, the so-called D-EPD of which has come down to from $10^4$ cm$^{-2}$ to $10^5$ cm$^{-2}$ as a result of improvement in the temperature distribution etc. of the pulling furnace, the D-EPD of the epitaxial layer on it does not necessarily coincide with the D-EPD of the epitaxial layer, the D-EPD of the epitaxial layer being found to be in the order of $1\times 10^5$ cm$^{-2}$ in many cases. The reason for this is perhaps that the density of the afore-mentioned conical pits does not decrease, but is in the order of $10^5$ cm$^{-2}$.

It may consequently be said that it is desirable for the substrate for a high effeciency green LED to have a sum of the density of these small conical etch pits (CS-EPD) and the density of the so-called dislocation etch pits (D-EPD) which does not exceed $1\times 10^5$ cm$^{-2}$, or $5\times 10^4$ cm$^{-2}$, if possible.

Now the present invention will be explained with reference to the examples of embodiment.

EXAMPLE 1

FIG. 3 is a schematic sectional view of the high temperature, high pressure single crystal pulling furnace which was used for the examples of embodiment of the present invention. In the Figure, 1 denotes a pressure chamber which is capable of being filled with such an inert gas 2 as argon gas, nitrogen gas, etc., up to a pressure of approximately 100 kg/cm$^2$. A heater 3 is provided in its interior, and a carbon crucible 4 and quartz crucible 5 are further provided in its interior upon a crucible driving means (axis) 6. When growing a GaP single crystal, GaP polycrystal, which is the raw material, and a dehydrated disc-shaped block of B$_2$O$_3$, which is the liquid encapsulant, are placed in the quartz crucible 5, which is then set in the pressure chamber 1, and heated in nitrogen gas filling the chamber to a pressure of about 50 kg/cm$^2$. In this manner, the raw material liquid 7 consisting of the melt of GaP is formed under the inert liquid 8 which is made of B$_2$O$_3$. Then a seed crystal 10 of GaP which is attached to the lower part of the pulling rod 9 is lowered and is brought into good contact with the GaP melt 7. A GaP single crystal 11 is grown if the pulling rod 9 is then raised at a speed of about 10 mm/hour while rotating it at a speed of about 10 r.p.m.

Figure 4:
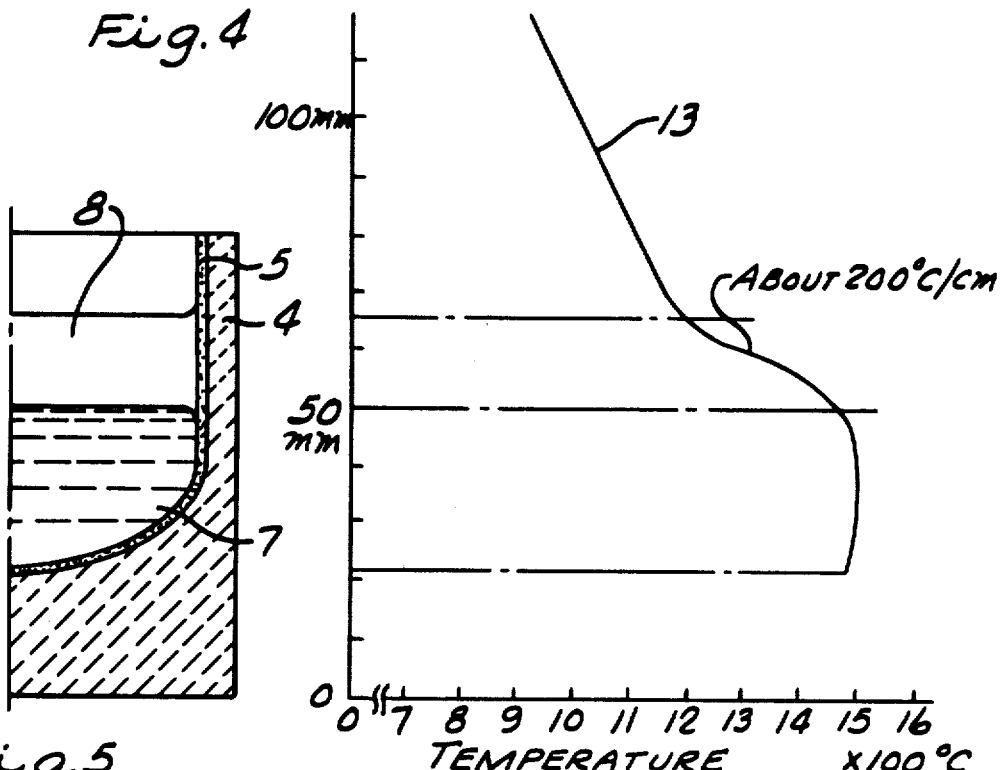
FIG. 4 is an enlarged one-side section of a portion of FIG. 3 in comparison combination with a diagram showing temperature distribution in the vertical direction.

Numeral 12 denotes the pressure seal between the crucible axis 6 and the pressure chamber 1. FIG. 4 is a composite view of an enlarged one-side sectional view of a portion of carbon crucible 4, quartz crucible 5, GaP raw material melt 7 and $B_2O_3$ inert liquid 8 shown in FIG. 3 and a related diagram showing the temperature distribution in the vertical direction. As shown by the temprature distribution curve 13 of FIG. 4, the temperature gradient in the $B_2O_3$ is approximately 200° C./cm, and shows a remarkable improvement as compared with the temperature gradients commonly known; for example, the value of 500° C./cm found in the report entitled "Liquid Encapsulated Czochralski Growth of 35 mm Diameter Single Crystals of GaP" by S. F. Nygren of the Bell Research Institute of U.S.A. (J. of Crystal Growth, 19 (1973) p. 21-23).

The $B_2O_3$ used here, which will be explained in detail later in the Example of Embodiment 4, was selected such that it was so dehydrated and degassed as to make the residual oxygen in the GaP melt 7 to be $1.5 \times 10^{-1}$ mol percent or less.

As a strongly reducing impurity for doping, 3.5 mg to about 150 mg of silicon was melted into about 400 g of GaP melt 7.

The quantity of the strongly reducing impurity, carrier concentration at 300° K., D-EPD and CS-EPD of the substrates and D-EPD of the epitaxial layers grown on them in the series of experiments in this Example of Embodiment are shown in Table 1.

Figure 7:
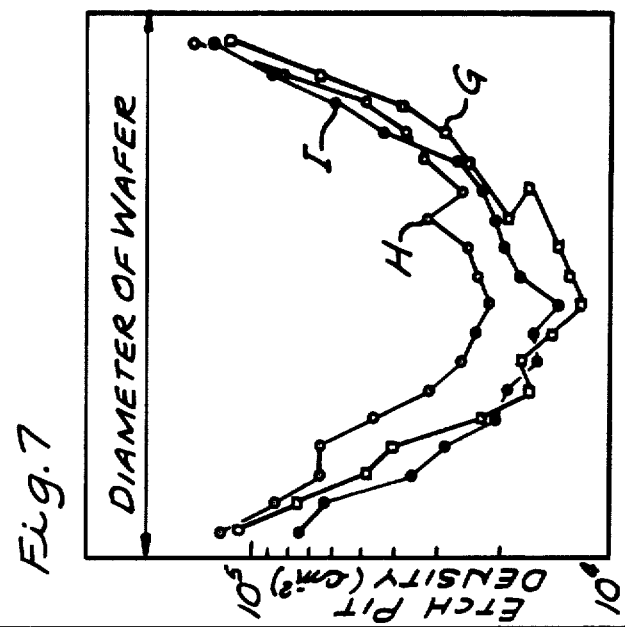

FIG. 7 is a diagram showing the D-EPD (curve G), D-EPD+CS-EPD (curve H) of the substrate and the EPD of the epitaxial layer (curve I) of Sample No. 7.

Figure 8:
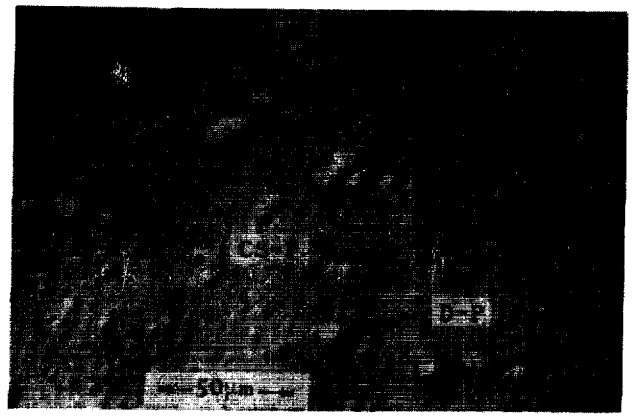

FIG. 8 is a photograph of the etching pattern of the substrate of Sample No. 7. This has a few more S pits than Sample No. 1, but much fewer than the ordinary sulphur-doped GaP substrate.

Under the pulling conditions of this example embodiment, namely, the method wherein a quartz crucible is used and encapsulation is effected with $B_2O_3$, if Si is added, it reacts with $B_2O_3$ and boron becomes dissolved in the melt, and if boron is added, it reacts with the quartz and Si is dissolved. That is to say, the reaction formula in this case can be given as follows:

$$3Si(l) + 2B_2O_3\ (l) = 4B(s) + 3SiO_2\ (\beta\text{-quartz}), \quad (1683° \sim 1883° \text{ K.}) \tag{1}$$

In the state of equilibrium $$\frac{a_B^4}{a_{Si}^3} = K \text{ (constant)} \tag{2}$$

where
  $a_B$: activity of B in GaP melt
  $a_{Si}$: activity of Si in GaP melt.

We can obtain K=0.0936 at T=1773° K. (melting point of GaP).

Now, if the segregation coefficients of Si and B are $K_{Si}$ and $K_B$ respectively, and the concentrations of Si and B in the GaP crystal are $n_{Si}$ and $n_B$ respectively, then

TABLE 1

| Sample No. | Experiment No. | Conc. of strongly reducing impurities in pulled crystals | | Carrier con. at 300° K. $cm^{-3}$ | D-EPD $cm^{-2}$ | CS-EPD $cm^{-2}$ | EPD of the epitaxial layer $cm^{-2}$ |
|---|---|---|---|---|---|---|---|
| | | Si $cm^{-3}$ | B $cm^{-3}$ | | | | |
| 1 | 112 | $7.8 \times 10^{16}$ | $2.7 \times 10^{17}$ | $1.3 \times 10^{17}$ | $4.7 \times 10^4$ | $1.1 \times 10^4$ | $5.3 \times 10^4$ |
| 2 | 142 | $1.6 \times 10^{17}$ | $1.9 \times 10^{16}$ | $8.5 \times 10^{16}$ | $4.3 \times 10^4$ | $2.4 \times 10^3$ | $7.6 \times 10^4$ |
| 3 | 143 | $4.9 \times 10^{17}$ | $1.9 \times 10^{14}$ | $1.0 \times 10^{17}$ | $3.0 \times 10^4$ | $6.7 \times 10^3$ | $5.3 \times 10^4$ |
| 4 | 151 | $4.9 \times 10^{17}$ | $5.4 \times 10^{18}$ | $6.2 \times 10^{17}$ | $8.5 \times 10^4$ | $4.7 \times 10^3$ | $2.7 \times 10^4$ |
| 5 | 126 | $4.9 \times 10^{17}$ | $1.9 \times 10^{14}$ | $9.0 \times 10^{16}$ | $3.5 \times 10^4$ | $1.2 \times 10^3$ | $8.5 \times 10^4$ |
| 6 | 122 | $1.6 \times 10^{18}$ | $5.4 \times 10^{19}$ | $6.5 \times 10^{17}$ | $2.1 \times 10^4$ | $2.7 \times 10^3$ | $6.1 \times 10^4$ |
| 7 | 137 | $1.6 \times 10^{18}$ | $1.9 \times 10^{19}$ | $6.0 \times 10^{17}$ | $6.1 \times 10^4$ | $1.6 \times 10^4$ | $5.8 \times 10^4$ |
| 8 | 110 | $4.8 \times 10^{18}$ | $2.7 \times 10^{19}$ | $4.5 \times 10^{17}$ | $3.3 \times 10^4$ | $8.0 \times 10^2$ | $3.3 \times 10^4$ |

The quantities of impurities in the crystals are expressed in values by mass-spectrographic analysis. The encapsulant $B_2O_3$ used was 120 g and the crystals pulled had a diameter of from 30 mm to 40 mm and a weight of from 300 g to 385 g.

The D-EPD and CS-EPD of the substrates and D-EPD of the epitaxial layers are given in average values for 5 points in the area of the wafer, except as its 5 mm circumferential area.

Figure 5:
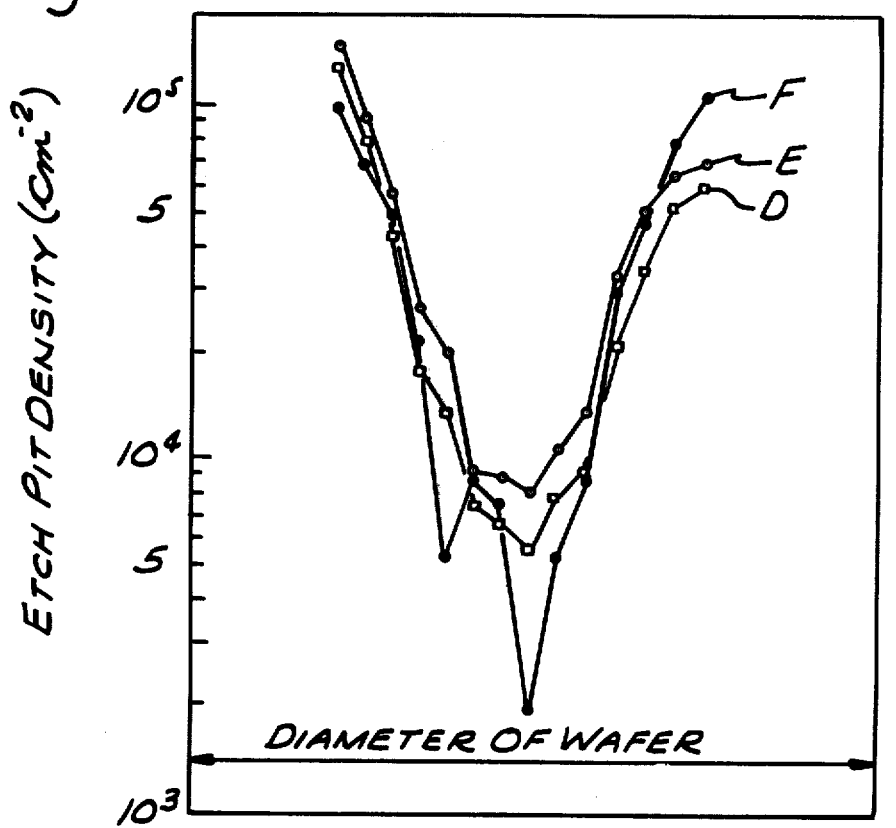
FIG. 5 and FIG. 7 are diagrams showing the distribution of etch pit density of single crystal wafers obtained in the examples of embodiment of the present invention.
Figure 6A:
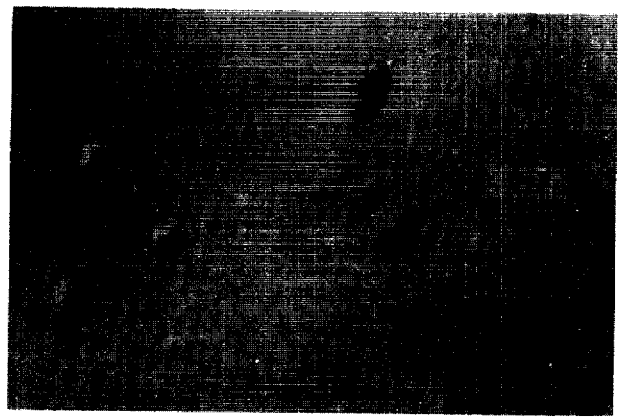
FIGS. 6(a), 6(b) and 8 are microscopic photographs of the etched surfaces of the substrates used for the measurements shown in FIGS. 5 and 7, respectively.
Figure 6B:
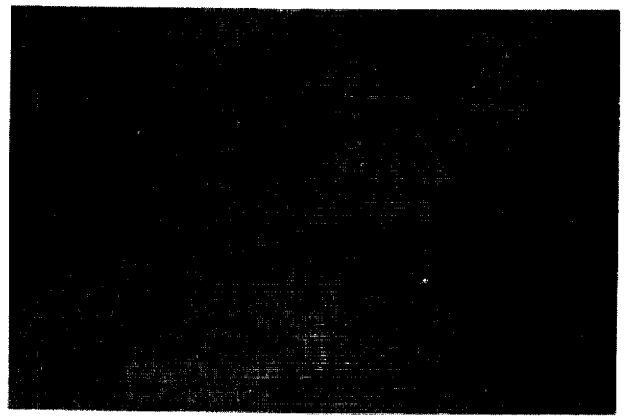

Regarding the Sample No. 1 (Experiment No. 112), the distributions in the wafer surface of the D-EPD, D-EPD+CS-EPD of the substrate and the D-EPD of the epitaxial layer are shown in FIG. 5. In FIG. 5, the curve D represents the D-EPD of the substrate, the curve E is the sum of CS-EPD and D-EPD of the substrate and the curve F represents the D-EPD of the epitaxial layer. FIGS. 6(a) and 6(b) are photographs of the etching pattern of the substrate of the same Sample No. 1. There are few S pits, the surface is clean and both dislocation etch pits and small conical etch pits are few. Small conical etch pits are pair pits in many cases.

$$n_{Si} = K_{Si} a_{Si}/\gamma_{Si} \tag{3}$$

$$n_B = K_B a_B/\gamma_B \tag{4}$$

where $\gamma_{Si}$ and $\gamma_B$ are activity coefficients of Si and B respectively.

Now, if $\gamma_{Si} \approx \gamma_B \approx 1$ on the assumption of an ideal solution, then from formulae (2), (3) and (4), $$n_B^4 = K \cdot n_{Si}^3 \cdot \frac{K_B^4}{K_{Si}^3} \tag{5}$$

The present inventors have confirmed this relationship by experiment and found that $n_B^4 n_{Si}^3 = 10^{20 \sim 23}$. The causes for this variation by three orders of magnitude are not known, but the fact that the values of mass-spectrographic analysis for the concentration measurement of Si and B involved error of factor 3 may perhaps be a cause.

If the concentration of one of Si and B is known, it is possible to presume that approximate concentration of the other from formula (5) in the case of pulling with a quartz crucible and $B_2O_3$ encapsulant, as mentioned above.

From the foregoing Table 1, it may be noted that when doped with boron, a strongly reducing impurity, in a quantity of $1 \times 10^{17}$ cm$^{-2}$ or more or with silicon in a quantity of $7 \times 10^{16}$ cm$^{-3}$ or more, a crystal with a low density of small conical pits, the sum of which with the D-EPD does not exceed $1 \times 10^5$ cm$^{-2}$, can be obtained, and this crystal has considerably lower crystal defect density than the ordinary sulphur-doped GaP crystal. It has also been found that the D-EPD of the epitaxial layer which was grown with this crystal as its substrate was $1 \times 10^5$ cm$^{-2}$ or less.

Regarding the roles of a strongly reducing impurity, namely silicon or boron in this case, on GaP crystals, it is considered that this impurity increases the mechanical strength of the crystal, makes it stronger against thermal stress, inhibits the introduction and multiplication of dislocations, decreases D-EPD and reduces the quantity of the unknown matter or impurity which is the case of CS-EPD. If the crystal is doped with silicon in the order of $10^{16}$ cm$^{-3}$ or boron in the order of $10^{17}$ cm$^{-2}$, a GaP with a low defect density is obtained, defects in the crystal, especially the so-called S pits and CS-EPD being decreased and D-EPD also being decreased to some degree. In such cases wherein the crystal is large-sized or the thermal stress in the crystal is great and the shape of the solid-liquid interface is poor, doping with silicon or boron in a larger quantity has a greater effect toward lowering the dislocation density.

On the other hand, if doping is done in a large quantity such as to make the silicon concentration $5 \times 10^{18}$ cm$^{-3}$, or more, or made in the order of $10^{19}$ cm$^{-3}$, then S pits related to precipitates make their appearance and the optical absorption coefficient also increases, thus making it undesirable for LED use. Consequently, a crystal doped with a silicon concentration ranging from $1 \times 10^{17}$ cm$^{-2}$ to $2 \times 10^{18}$ cm$^{-3}$ is most suitable as a substrate for LED use.

However, when it is preferable that the optical absorption of the substrate be great and also that the dislocation etch pit density of the epitaxial layer be low for making a monolithic type alpha-numeric display or the like, it is possible to use a crystal doped with $2 \times 10^{16}$ cm$^{-3}$ or more of silicon.

EXAMPLE 2

In the same manner as in Example 1, sulphur, which is an electrically active n-type impurity, was added to the raw material GaP in the form of GaS at the same time that silicon was added into the raw material GaP. Doping was made in the crystal to a silicon concentration of between $1 \times 10^{17}$ cm$^{-3}$ and $2 \times 10^{18}$ cm$^{-2}$, and to a sulphur concentration of $1-8 \times 10^{17}$ cm$^{-3}$.

These crystals were likewise investigated with RC etchant to see their crystalline properties. Also, an epitaxial layer having a p-n junction with nitrogen (N) doping was grown on them as substrates. Their EPD was measured, and made into green LED and their electroluminescent efficiency was measured. The sum of D-EPD and CS-EPD of the substrate did not exceed $1 \times 10^5$ cm$^{-2}$, except in the circumferential 5 mm area, just as in Example 1. Likewise, the D-EPD of the epitaxial layer was also $1 \times 10^5$ cm$^{-2}$, or less. The electroluminescent efficiency was found to be 0.09% ~0.14% (without epoxy coating), which is about 50% ~100% higher as compared with the mean value of 0.06% ~0.07% of the green LED made from the epitaxial layer with a p-n junction with is likewise doped with nitrogen and grown on the ordinary sulphur doped (carrier concentration at 300° K: $2 \sim 8 \times 10^{17}$ cm$^{-3}$) substrate whose EPD is in order of $10^5$ cm$^{-3}$.

As mentioned above, GaP single crystals which are doped with at least one electrically active n-type impurity together with at least one strongly reducing impurity also have the low crystal defects, that is to say, the sum of D-EPD and CS-EPD is $1 \times 10^5$ cm$^{-2}$ or less, and epitaxial layers with a low dislocation density of $1 \times 10^5$ cm$^{31\ 2}$ are also obtained on these crystals as substrates.

EXAMPLE 3

As in Example 1, silicon was added to the raw material GaP melt and at the same time Zn, which is an electrically active p-type impurity, was added in a quantity such that it would be taken up in the crystal in a larger quantity than the quantity of silicon to be taken up in the crystal. Silicon concentration in the crystals was $1 \times 10^{17}$ cm$^{-3}$ to $5 \times 10^{17}$ cm$^{-3}$, and crystals with p-type electrical characteristics and a carrier concentration at room temperature of $1 \times 10^{17}$ cm$^{-3}$ to $8 \times 10^{17}$ cm$^{-3}$ were obtained. As in Example 1, crystalline properties were investigated by etching, and the EPD of the epitaxial layers was also investigated. According to the results, the sum of D-EPD and CS-EPD of these p-type substrates was found to be $1 \times 10^5$ cm$^{-2}$ or less, and the EPD of the epitaxial layer was also $1 \times 10^5$ cm$^{-2}$ or less. As mentioned above, p-type GaP single crystals with few defects were obtained by doping with a strongly reducing impurity together with a p-type impurity.

EXAMPLE 4

Figure 9:
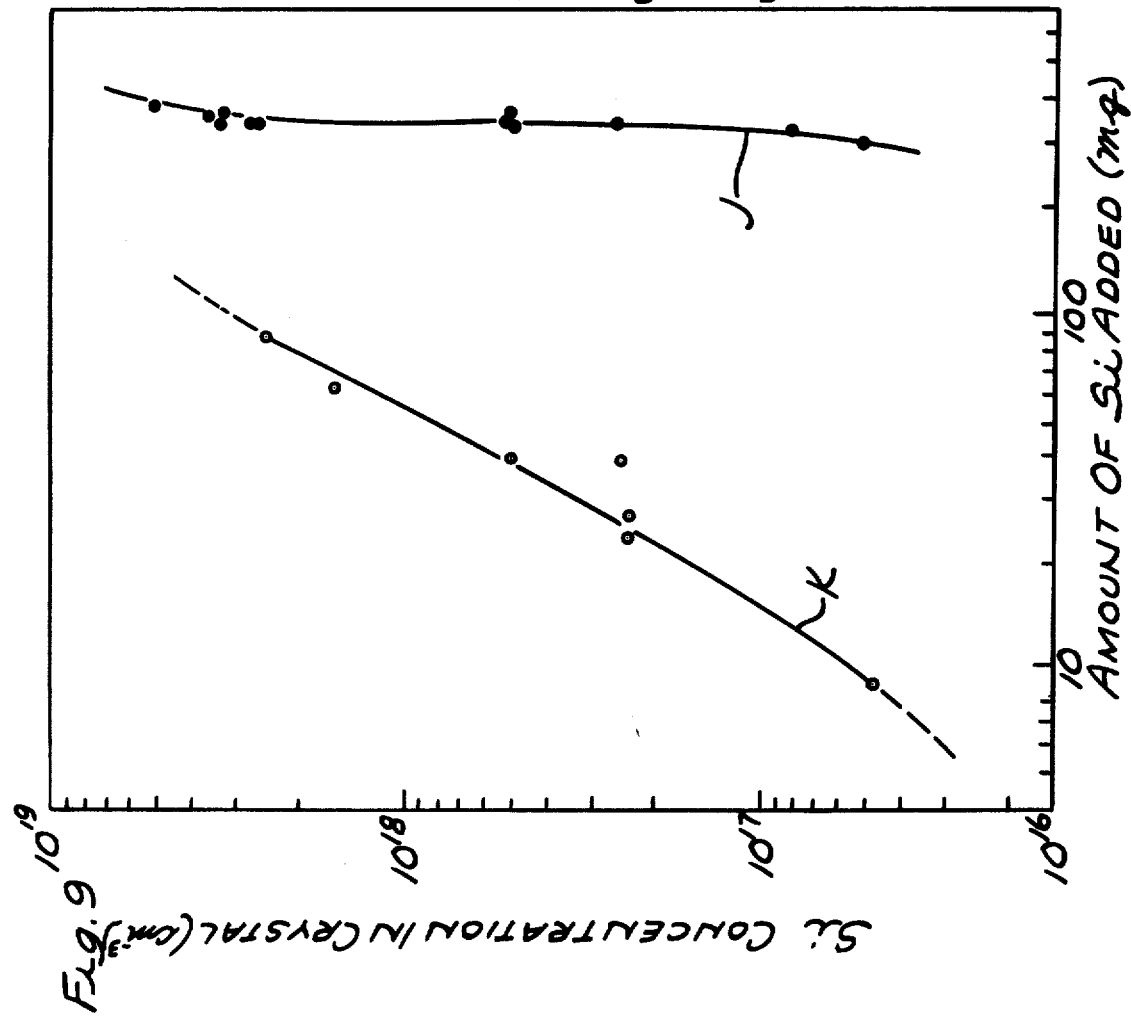
FIG. 9 is a diagram showing correspondence between Si added and Si concentration in the pulled crystal in an example of embodiment of the present invention.

This Example of Embodiment relates to a method of making GaP single crystals with few crystalline defects by doping GaP crystals with a strongly reducing impurity as desired with good reproducibility. FIG. 9 shows the results of experiments carried out to investigate the relationship between the quantity of Si added to the raw material melt of GaP and the quantity of silicon doped in the crystal. The curve J in the Figure represents the results in the case wherein the ordinary $B_2O_3$ heat-treatment for about 10 hours at 1000° C. was used. In the course of the 10 hours' heat-treatment, a step was added wherein $B_2O_3$ was heated for 10 to 30 minutes under a vacuum of $10^{-1}$ to $10^{-2}$ Torr until foaming of the $B_2O_3$ became small. Before and after that step, heat-treatment was made in the air.

The pulling experiment was made just as mentioned in Example 1. The raw material GaP was in the quantity of 400 g, $B_2O_3$ was 120 g, the crucible was of quartz, and the substitution of gas in the chamber was made by expelling the air by means of a rotary pump and pressurizing $N_2$ gas of a 99.99% purity to 56 kg/cm$^2 \sim 58$ kg/cm$^2$.

From the curve J in FIG. 9, it can be seen that in order to dope the crystal with $5 \times 10^{17}$ cm$^{-3}$ of silicon, it is necessary to add approximately 340 mg of silicon. It is also discovered that there are sometimes situations wherein the crystal is doped to the $10^{16}$ cm$^{-3}$ level from the addition of 320 mg and to the $10^{18}$ cm$^{-3}$ level from the addition of 360 mg. From this, it can be seen that the silicon concentration in the crystal changes abruptly when the quantity of silicon added for doping is in the neighborhood of 340 mg, and that even if 340 mg to 380 mg is added for doping, the results have variations from the $10^{17}$ cm$^{-3}$ level to the $10^{18}$ cm$^{-3}$ level, it being difficult to effect an accurate doping. The curve K in FIG. 9 represents the results of experiments of pulling carried out under the same conditions except the conditions of dehydration treatment of the $B_2O_3$ were altered.

The new conditions of dehydration treatment of the $B_2O_3$ were as follows: After the afore-mentioned heat-treatment at 1000° C. for 10 hours, vacuum treatment was additionally given at 1000° C. for about 30 minutes under a vacuum of $10^{-1}$ to $10^{-2}$ Torr with a rotary vacuum pump, and sufficient care was taken in subsequent treatments not to allow moisture in the atmosphere to be absorbed. According to the results, when the quantity of silicon added to the raw material melt was approximately 35 mg, the crystal was doped with $5 \times 10^{17}$ cm$^{-3}$ of silicon. When about 25 mg was added, the crystal was doped with $2.4 \times 10^{17}$ cm$^{-3}$, and when about 60 mg was added, doping was effected with $1.5 \times 10^{18}$ cm$^{-3}$.

When the curves J and K in FIG. 9 are compared, it will be seen that an addition of silicon in a quantity of about one-tenth is sufficient for curve K as compared to curve J, and that curve K has a milder inclination than curve J, indicating that doping with a silicon concentration in the crystal in the range of $1 \times 10^{17}$ cm$^{-3}$ to $2 \times 10^{18}$ cm$^{-3}$ is more easily done. This difference is chiefly because they are different with respect to the quantity of moisture and $O_2$ gas in the $B_2O_3$ which dissolve in the raw material melt as a residual oxygen. That is to say, if moisture and $O_2$ gas in the $B_2O_3$ are not sufficiently removed, most of Si added reacts with residual oxygen and will not be taken up effectively in the crystals. For example, curve J indicates that 340 mg of Si is added to effect doping with a concentration of $5 \times 10^{17}$ cm$^{-3}$, while curve K indicates that only 35 mg of Si need be added for doping with that same concentration. It is considered that this difference of about 300 mg of Si has reacted with residual oxygen.

It is noted on the other hand with respect to variations in the value of residual oxygen that the experiments of curve J had some situations wherein an addition of 340 mg effected doping of about $2 \times 10^{18}$ cm$^{-3}$ Si and some other situations wherein an addition of 370 mg effected doping of only about $5 \times 10^{15}$ cm$^{-3}$ Si, so that there are variations of at least about 30 mg and the oxygen that enters the melt from moisture and $O_2$ gas in the $B_2O_3$ varies by about 10%.

Now, it is assumed that these variations could be suppressed down to 20% or less. If dehydration and degassing of the $B_2O_3$ are effected so as to put it within the optimum doping range of Si mentioned in Example 1, which is from $1 \times 10^{17}$ cm$^{-3}$ to $2 \times 10^{18}$ cm$^{-3}$, the quantity of oxygen permissible in the melt for practical purposes can be calculated in the following way.

According to curve K, an addition of about 18 mg is sufficient to dope the crystal with $1 \times 10^{17}$ cm$^{-3}$. For $2 \times 10^{18}$ cm$^{-3}$ doping, an addition of about 80 mg is sufficient. Consequently, in order to put it in the prescribed range in spite of the variation of residual oxygen, it is permissible if there is a variation of residual oxygen corresponding to the Si quantity of (80−18)/2, that is, 31 mg. As this is said to be 20% of the average residual oxygen, the average residual oxygen will correspond to 155 mg of the Si quantity.

Curve K does not indicate a complete freedom from residual oxygen, either, but it is necessary to estimate a maximum of about 18 mg. Consequently, residual oxygen up to a quantity corresponding to the Si quantity of the total 178 mg should be permissible for practical purposes.

The reaction formula for Si and residual oxygen is $Si + O_2 \rightarrow SiO_2$, so that the Si quantity of 178 mg corresponds to $6.16 \times 10^{-3}$ mol of $O_2$ molecules. As 400 g of raw material GaP is used, the residual oxygen in the melt, if calculated as $O_2$ molecules, has $1.55 \times 10^{-1}$ mol percents as against the GaP molecules.

It is therefore possible to make crystals doped with Si which ranges in concentration from $1 \times 10^{17}$ cm$^{-3}$ to $2 \times 10^{18}$ cm$^{-3}$ with good reproducibility by carrying out the addition of Si under the condition that the oxygen remaining in the GaP melt shall not exceed 0.15 mol percents as $O_2$ molecules as against the GaP molecules.

The foregoing explanation has been given with reference to the addition of silicon. However, the same may be said as to cases where other strongly reducing impurities are added to the raw material, such as cases wherein aluminum is added, cases wherein boron is added for doping, etc.

EXAMPLE 5

Doping with aluminum as a strongly reducing impurity was experimented with and two types of crucibles were used.

Doping as carried out in the following manner. The Al for doping was put in contact with about 5 g of Ga and placed in the crucible with the raw material GaP so that the GaP and Al might become melted and mixed together while the temperature was being raised, thereby avoiding as much as possible direct reaction between the Al and $B_2O_3$. The $B_2O_3$ that was used was as fully dehydrated as possible, as mentioned in Example 4.

Table 2 shows the quantities of impurities in the crystals pulled which were measured by mass-spectrographic analysis. Oxygen (0) is not shown in the Table because the measurement value is inaccurate.

TABLE 2

| Sample No. | Impurities in the crystals (Values by mass-spectrographic analysis) | | | | (Atomic ppm) | | | |
|---|---|---|---|---|---|---|---|---|
| | B | Si | Al | S | C | Na | N | Others |
| 1 | 380 ($1.9 \times 10^{19}$) | 100 ($4.9 \times 10^{18}$) | 90 ($4.5 \times 10^{18}$) | N.D. | 3 | 4.5 | 3 | 1 or less (0 inaccurate) |
| 2 | 38 ($1.9 \times 10^{18}$) | 0.2 ($9.8 \times 10^{15}$) | 3.5 ($1.5 \times 10^{17}$) | 5.0 ($2.5 \times 10^{17}$) | 15 | 9 | 1.5 | 1 or less (0 inaccurate) |

Notes:
1 One atomic ppm is equivalent to concentration of $5 \times 10^{16}$ cm$^{-3}$.
2 Figures in parentheses are values obtained by conversion into concentration (cm$^{-3}$) per unit volume.

Sample No. 1 in Table 2 was pulled with a quartz crucible in use. According to the results of mass-spectrographic analysis, the crystal was found to be doped with boron in the largest quantity, and silicon and aluminum come next. The reason for this is considered to be that Al, because of its strong reducing activity, reduced quartz ($SiO_2$) and $B_2O_3$, so that Si and B became dissolved in the melt and the Al became $Al_2O_3$. By nature, it is difficult to consider that the Al gets into the crystal to dope it. Even if it is taken in, it is considered to be limited to the proximity of the seed. It is thought that the reason why such a large quantity of Al as is found in Sample 1 of Table 2 was detected is that what had been taken up in the crystal in the form of an oxide could not be separately detected by mass-spectrographic analysis from elemental Al, but was detected as the total Al concentration.

The pulled crystal, as with those doped with $10^{18}$ cm$^{-3}$ or more of Si in Example 1, had a sum of D-EPD and CS-EPD of $1\times10^5$ cm$^{-2}$ or less. The EPD of the epitaxial growth layer was also found to be $1\times10^5$ cm$^{-2}$ or less.

Needless to say, GaP single crystals that have low defect density likewise can be obtained when an electrically active impurity is doped at the same time.

Carbon (C), Sodium (Na) and nitrogen (N) may be found about in these quantities also in the ordinary sulphur-doped crystals with many defects, so they are not especially peculiar to this Example of Embodiment.

Next, the present inventors tried doping with Al, using carbon as material for the crucible. (Sample 2 of Table 2).

Again, 51 mg of Al was used, while the raw material GaP was 400 g and $B_2O_3$ was 120 g. The Al dopant was added to the crucible in the condition of being in contact with 5 g of Ga as just already described. The crystal pulled weighed approximately 310 g.

As shown for Sample 2 in Table 2, the crystal is found doped with scarcely any Si, doped with approximately $1.5\times10^{17}$ cm$^{-3}$ Al which is considered to be in the form of an oxide, and doped with boron in the largest quantity of approximately $2\times10^{18}$ cm$^{-3}$. As regards defects in the crystal, D-EPD and CS-EPD are low just as those described in Example 1. The sum of D-EPD ad CS-EPD averaged for 5 points in the wafer except its 5 mm circumferential area was $8\times10^4$ cm$^{-2}$.

The EPD of the epitaxial growth layer was likewise found to be $1\times10^5$ cm$^{-2}$ or less.

EXAMPLE 6

In this Example of Embodiment, the poly-crystal as the raw material was previously doped with approximately 20 mg of boron. Pulling was carried out with 400 g of GaP poly-crystals used as raw material. The crucible used was of quartz and the encapsulant $B_2O_3$ was fully dehydrated and degassed before use.

The pulled crystal was found to be doped with $2.4\times10^{17}$ cm$^{-3}$ of silicon and $5.4\times10^{18}$ cm$^{-3}$ of boron. Like those obtained in Example 1, this pulled crystal also had few crystal defects, and the sum of D-EPD aand CS-EPD was $5.8\times10^4$ cm$^{-2}$ on the average for 5 points measured at equal intervals in the direction of the diameter, except a 5 mm circumferential area of the wafer. The EPD of the epitaxial layer grown thereon was also low, it being found to be $7\times10^4$ cm$^{-2}$. As regards the method of adding boron, needless to say, the single substance of boron may be melted in the raw material melt instead of using poly-crystals previously doped with boron.

As has been stated, the gallium phosphide single crystals of the present invention are single crystals with a low defect density that are doped with at least one of such strongly reducing impurities as silicon and boron in a quantity of not less than $1\times10^{17}$ cm$^{-3}$, and have a low D-EPD and also a low density of conical small etch pits, the sum of these two not exceeding $1\times10^5$cm$^{-2}$, and when this single crystal is used as a substrate, the EPD of the epitaxial growth layer also becomes $1\times10^5$ cm$^{-2}$ or less. The method provided by the present invention is a method of manufacturing the aforementioned gallium phosphide single crystals with a low defect density in which crystals are doped with the aforementioned strongly reducing impurity as aimed at with good reproducibility by making the concentration of residual oxygen in the gallium phosphide raw material melt 0.15 mol percents or less.

We claim:

1. A method of manufacturing gallium phosphide single crystals with low defect density, which have a sum of dislocation etch pit density and small conical etch pit density that does not exceed $1\times10^5$ cm$^{-2}$ on the (111)B surface of said crystals after removal of mechanically damaged surface layer and subjection to etching with RC etchant for 3~5 minutes at a temperature of 65° C.~75° C., by the liquid encapsulation Czochralski pulling method using a liquid encapsulant and which is characterized by controlling the Czochralski method in the steps of selecting a temperature gradient in the liquid encapsulant ($B_2O_3$) which is approximately 200° C./cm, doping with at least one kind of strongly reducing impurity selected from a group of impurities which have reducing activity equal to or greater than that of boron under such conditions that oxygen concentration in the raw material gallium phosphide melt does not exceed 0.15 mol percents, and thereby doping the pulled crystals with $1\times10^{17}$ cm$^{-3}$ or more of said strongly reducing impurity with good reproducibility.

2. A method of manufacturing gallium phosphide single crystals as claimed in claim 1, with is further characterized in that a pulling speed of about 10 mm/hr. is employed.

3. A method of manufacturing gallium phosphide single crystals as claimed in claim 3, which is further characterized in that a rotating speed of about 10 r.p.m. is employed.

4. A method of manufacturing gallium phosphide single crystals with low defect density, which have a sum of dislocation etch pit density and small conical etch pit density that does not exceed $1\times10^5$ cm$^{-2}$ on the (111)B surface of said crystals after removal of mechanically damaged surface layer and subjection to etching with RC etchant for 3~5 minutes at a temperature of 65° C.~75° C., by the liquid encapsulation Czochralski pulling method using a liquid encapsulant and which is characterized by controlling the Czochralski method in the steps of (a) doping with at least one kind of strongly reducing impurity selected from a group of impurities which have reducing activity equal to or greater than that of boron under such conditions that oxygen concentration in the raw material gallium phosphide melt does not exceed 0.15 mol percents, (b) controlling said oxygen concentration by giving additional vacuum heat-treatment to the liquid encapsulant at 1,000° C. for about 30 minutes under a vacuum of $10^{-1}$ to $10^{-2}$ Torr after ordinary heat-treatment for about 10 hours at 1,000° C. in the air, (c) and thereby doping the pulled crystals with $1\times10^{17}$ cm$^{-3}$ or more of said strongly reducing impurity with good reproducibility.

* * * * *